(12) United States Patent
Murakami

(10) Patent No.: US 11,892,770 B2
(45) Date of Patent: Feb. 6, 2024

(54) IMPRINT SYSTEM, REPLICA MOLD MANUFACTURING APPARATUS, AND ARTICLE MANUFACTURING METHOD

(71) Applicant: CANON KABUSHIKI KAISHA, Tokyo (JP)

(72) Inventor: Yosuke Murakami, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 437 days.

(21) Appl. No.: 16/794,537

(22) Filed: Feb. 19, 2020

(65) Prior Publication Data
US 2020/0285146 A1 Sep. 10, 2020

(30) Foreign Application Priority Data

Mar. 8, 2019 (JP) ................................. 2019-043043

(51) Int. Cl.
G03F 7/00 (2006.01)
B29C 33/38 (2006.01)

(52) U.S. Cl.
CPC ........ *G03F 7/0002* (2013.01); *B29C 33/3842* (2013.01)

(58) Field of Classification Search
CPC .... G03F 7/0002; G03F 9/7019; G03F 7/0015; B29C 33/3842; B29C 59/002; H01L 21/027
See application file for complete search history.

(56) References Cited

U.S. PATENT DOCUMENTS

| 2012/0090489 | A1* | 4/2012 | Suzuki | G03F 7/0002 |
| | | | | 101/485 |
| 2013/0056903 | A1* | 3/2013 | Hayashi | B82Y 10/00 |
| | | | | 264/293 |
| 2016/0223919 | A1* | 8/2016 | Nakagawa | G03F 9/7042 |
| 2016/0271845 | A1* | 9/2016 | Yamazaki | G03F 7/0002 |
| 2017/0210036 | A1* | 7/2017 | Hamaya | B29C 33/3842 |

FOREIGN PATENT DOCUMENTS

| JP | 2012089636 A | 5/2012 |
| JP | 2013055327 A | 3/2013 |
| JP | 2018098306 A | 6/2018 |

OTHER PUBLICATIONS

Notice of Reasons for Refusal issued by the Japan Patent Office dated Aug. 12, 2022 in corresponding JP Patent Application No. 2019-043043, with English translation.
Korean Office Action dated Oct. 24, 2023 in corresponding KR Patent Application No. 10-2020-0023305, with English translation.

* cited by examiner

*Primary Examiner* — Emmanuel S Luk
*Assistant Examiner* — Inja Song
(74) *Attorney, Agent, or Firm* — Carter, DeLuca & Farrell LLP

(57) ABSTRACT

An imprint system includes a replica mold manufacturing apparatus which manufactures a replica mold of a master mold by performing a first imprint process using the master mold, an imprint apparatus which performs a second imprint process using the replica mold, and a controller which controls a first imprint condition that is an imprint condition of the first imprint process and a second imprint condition that is an imprint condition of the second imprint process. The controller corrects the first imprint condition based on an overlay state between a pattern formed on a shot region by the second imprint process and the shot region.

9 Claims, 10 Drawing Sheets

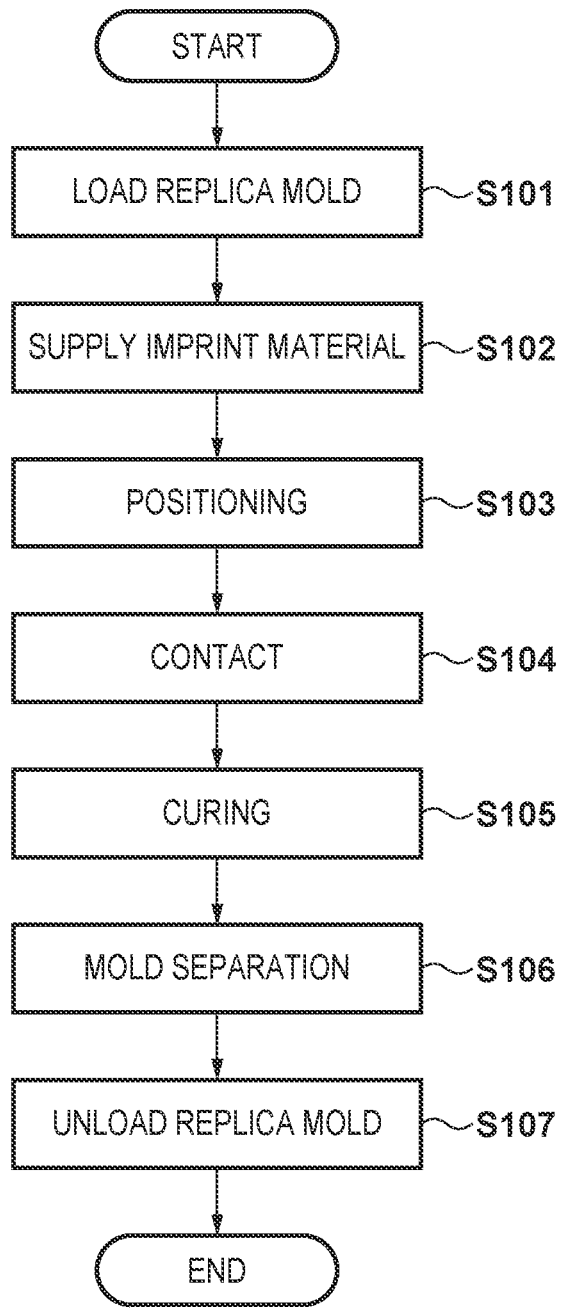
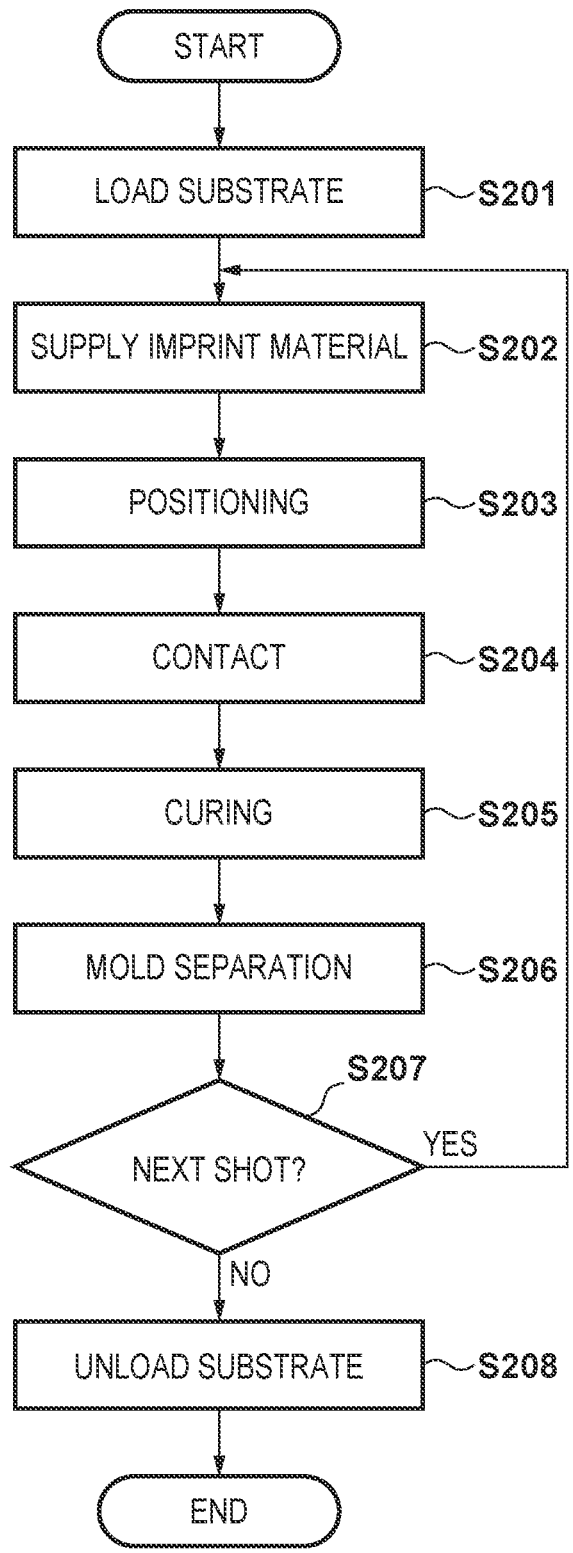

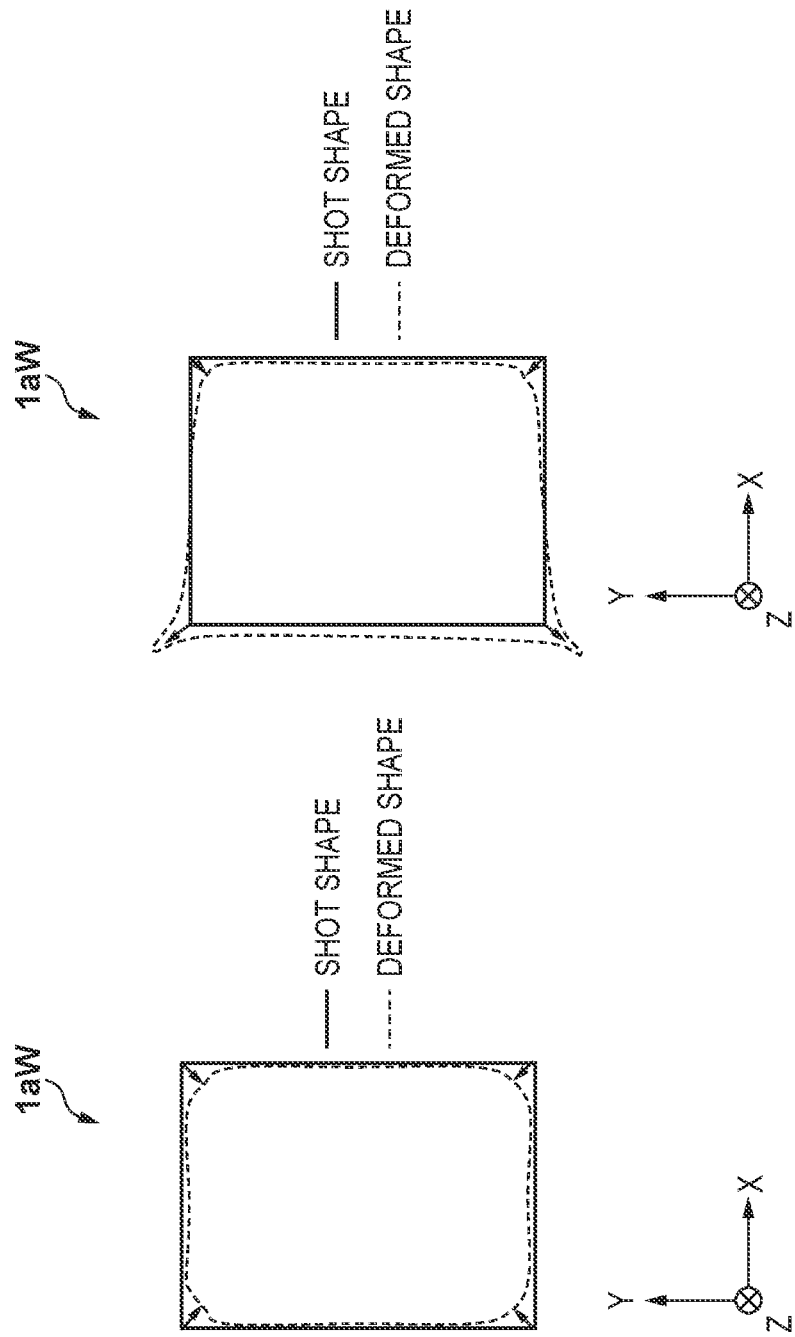

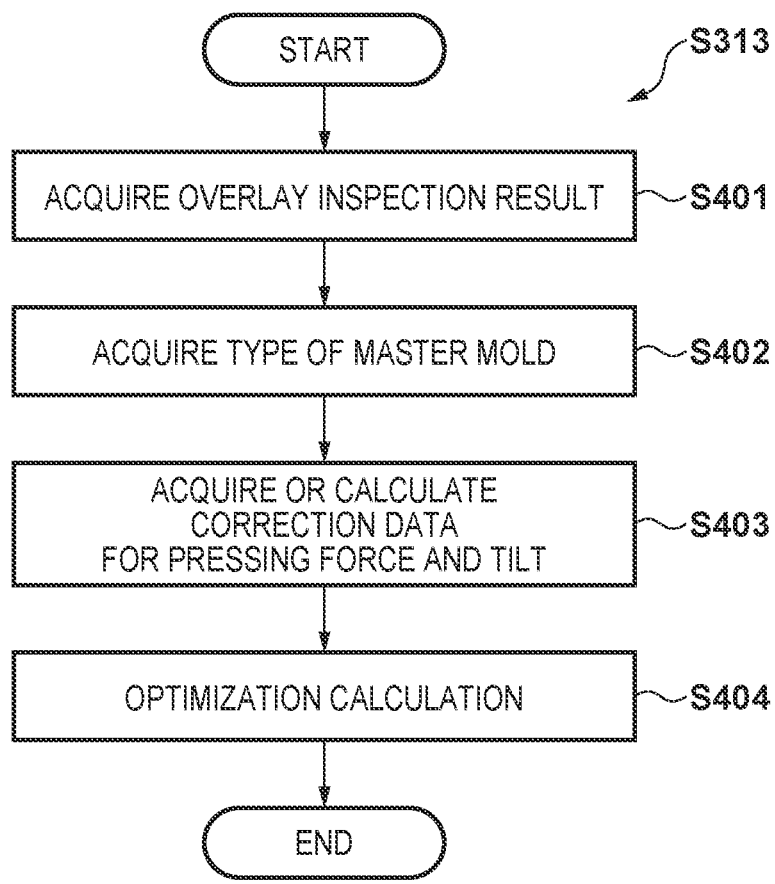

IMPRINT SYSTEM, REPLICA MOLD MANUFACTURING APPARATUS, AND ARTICLE MANUFACTURING METHOD

BACKGROUND OF THE INVENTION

Field of the Invention

The present invention relates to an imprint system, a replica mold manufacturing apparatus, and an article manufacturing method.

Description of the Related Art

An imprint apparatus has attracted attention as a new pattern forming apparatus for manufacturing semiconductor devices. The imprint apparatus cures an imprint material on a substrate such as a silicon wafer or a glass plate while the imprint material is in contact with a mold, and separates the mold from the cured imprint material, thereby forming a pattern of the imprint material on the substrate.

In the imprint apparatus, it is important to adjust the contact state between the mold and the imprint material on the substrate in order to reduce the shape difference between the mold and the substrate, or to reduce the distortion of the mold pattern (for example, see Japanese Patent Laid-Open No. 2013-055327).

The imprint technique can also be utilized for a technique of manufacturing a replica mold using a master mold (for example, see Japanese Patent Laid-Open No. 2018-098306).

When the contact state between the mold and the imprint material on the substrate is adjusted to reduce the shape difference between the mold and the substrate, the imprint material may be extruded to the outside of a shot region of the substrate depending on the adjustment amount. If the imprint material is extruded into an adjacent region, there is a possibility that when performing an imprint process on the adjacent region, the mold gets on the imprint material that has extruded out so a proper imprint process cannot be performed. In addition, the imprint material that has extruded out may adhere to the mold, which may affect the next imprint process.

On the other hand, if the contact state between the mold and the imprint material on the substrate is adjusted so as not to cause such extrusion, the overlay accuracy between the mold and the shot region may be deteriorated.

SUMMARY OF THE INVENTION

The present invention provides an imprint system advantageous in, for example, both suppression of extrusion of an imprint material and the overlay accuracy between a mold and a substrate.

The present invention in its one aspect provides an imprint system comprising a replica mold manufacturing apparatus configured to manufacture a replica mold which is a replica of a master mold by performing a first imprint process of bringing the master mold into contact with an imprint material on a blank mold to form a pattern of the imprint material, an imprint apparatus configured to perform a second imprint process of bringing the replica mold manufactured by the replica mold manufacturing apparatus into contact with an imprint material on a shot region of a substrate to form a pattern of the imprint material, and a controller configured to control a first imprint condition that is an imprint condition of the first imprint process and a second imprint condition that is an imprint condition of the second imprint process, wherein the controller corrects the first imprint condition based on an overlay state between the pattern formed on the shot region by the second imprint process and the shot region.

Further features of the present invention will become apparent from the following description of exemplary embodiments (with reference to the attached drawings).

BRIEF DESCRIPTION OF THE DRAWINGS

FIG. 3A is a flowchart showing an imprint operation performed by the mold imprint apparatus according to the embodiment;

FIG. 3B is a flowchart showing an imprint operation performed by the substrate imprint apparatus according to the embodiment;

FIGS. 5A and 5B are views each showing an example of deformation of a pattern region of a replica mold;

FIG. 7 is a flowchart showing an example of mold imprint condition setting processing according to the embodiment;

DESCRIPTION OF THE EMBODIMENTS

Figure 1:
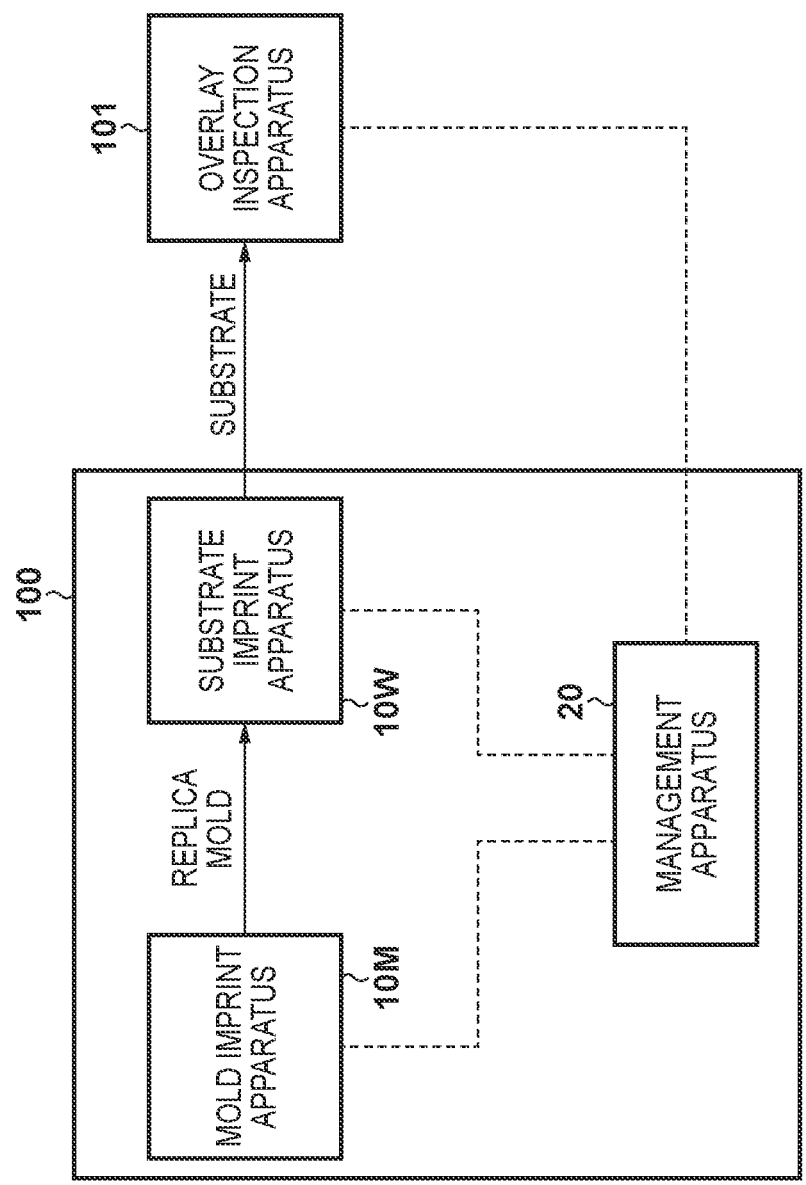
FIG. 1 is a view showing the arrangement of an imprint system according to an embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

In this specification and the attached drawings, directions are indicated in an XYZ-coordinate system in which an XY plane is set to be parallel to the surface of a substrate. Directions parallel to the X-axis, the Y-axis, and the Z-axis are referred to as the X direction, the Y direction, and the Z direction, respectively. Reference symbols θx, θy, and θz denote the rotation about the X-axis, the rotation about the Y-axis, and the rotation about the Z-axis, respectively. Control or driving related to the X-axis, the Y-axis, and the Z-axis represent control or driving performed in relation to a direction parallel to the X-axis, a direction parallel to the Y-axis, and a direction parallel to the Z-axis, respectively. Also, control or driving related to the θX-axis, the θY-axis, and the θZ-axis represent control or driving performed in relation to a rotation about an axis parallel to the X-axis, a rotation about an axis parallel to the Y-axis, and a rotation about an axis parallel to the Z-axis, respectively. In addition, a position is information that can be specified based on the coordinates of the X-axis, the Y-axis, and the Z-axis, and an orientation is information that can be specified based on the values of the θX-axis, the θY-axis, and the θZ-axis. Positioning represents controlling the position and/or the orientation.

Firstly, an overview of an imprint apparatus according to an embodiment will be described. The imprint apparatus is an apparatus that brings an imprint material supplied onto a substrate into contact with a mold and supplies curing energy to the imprint material to form a pattern of the cured material to which a concave-convex pattern of the mold is transferred.

As an imprint material, a curable composition (to be sometimes called an uncured resin) that is cured upon application of curing energy is used. As curing energy, electromagnetic waves, heat, or the like can be used. Electromagnetic waves can be, for example, light selected from the wavelength range of 10 nm or more and 1 mm or less, for example, infrared light, visible light, or ultraviolet light, or the like. A curable composition can be a composition that is cured by being irradiated with light or by being heated. Of these compositions, a photo-curable composition that is cured by being irradiated with light contains at least a polymerizable compound and a photopolymerization initiator, and may further contain a non-polymerizable compound or a solvent, as needed. A non-polymerizable compound is at least one type of compound selected from the group consisting of a sensitizer, hydrogen donor, internal mold release agent, surfactant, antioxidant, and polymer component. An imprint material supply apparatus can arrange an imprint material on a substrate in the form of droplets or islands or films formed from a plurality of droplets connected to each other. The viscosity (the viscosity at 25° C.) of the imprint material can be, for example, 1 mPa·s or more and 100 mPa·s or less. As a material for a substrate, for example, glass, ceramic, metal, semiconductor, or resin can be used. The surface of a substrate may be provided with a member made of a material different from that of the substrate, as needed. For example, a silicon wafer, a compound semiconductor wafer, silica glass, or the like is used as the substrate.

In an imprint technique, it is required to bring an imprint material supplied onto a substrate into direct contact with a mold (an original or a template). Repeated use of the mold accompanying such contact may cause deformation of the pattern of the mold. That is, the mold has a lifetime. Since the mold is generally expensive, the frequency of replacement should be as low as possible. Therefore, the original master mold is not used for a device manufacturing imprint process, but a replica mold manufactured by a master mold replication process is used in a device manufacturing imprint apparatus.

FIG. 1 is a view showing the arrangement of an imprint system 100 according to the embodiment. The imprint system 100 includes a mold imprint apparatus 10M, a substrate imprint apparatus 10W, and a management apparatus 20. The mold imprint apparatus 10M is a replica mold manufacturing apparatus that manufactures a replica mold which is a replica of a master mold. The mold imprint apparatus 10M performs an imprint process (first imprint process) of bringing the master mold into contact with an imprint material on a blank mold to form a pattern of the imprint material, thereby manufacturing the replica mold. The substrate imprint apparatus 10W (imprint apparatus) performs an imprint process (second imprint process) of bringing the replica mold manufactured by the mold imprint apparatus 10M into contact with an imprint material on a substrate to form a pattern of the imprint material. The management apparatus 20 is communicably connected to the mold imprint apparatus 10M and the substrate imprint apparatus 10W, and controls the respective components of the both apparatuses 10M and 10W. In addition, the management apparatus 20 manages imprint process conditions and the like of the both apparatuses 10M and 10W. The management apparatus 20 can be implemented by, for example, a computer apparatus including a CPU and a memory. For example, as indicated by dashed lines in FIG. 1, the mold imprint apparatus 10M and the substrate imprint apparatus 10W are interconnected via the management apparatus 20 and a network line so that they can communicate with each other. In addition, the management apparatus 20 is communicably connected to an overlay inspection apparatus 101 via a network. The overlay inspection apparatus 101 may be included in the imprint system 100, or may be arranged outside the system as shown in FIG. 1.

FIG. 1 shows one mold imprint apparatus 10M and one substrate imprint apparatus 10W, but a plurality of the mold imprint apparatuses 10M and a plurality of the substrate imprint apparatuses 10W may be arranged. Note that the mold imprint apparatus 10M manufactures a replica mold from a master mold, but the master mold herein can include not only an original master mold but also a replica mold. That is, the mold imprint apparatus 10M can manufacture another replica mold from one replica mold.

The replica mold manufactured by the mold imprint apparatus 10M is processed by, for example, a processing machine (not shown) and then loaded into the substrate imprint apparatus 10W. The substrate imprint apparatus 10W performs an imprint process on a substrate using the loaded replica mold. The substrate having undergone the imprint process is loaded into a processing machine (not shown) for next processing. As least some of a plurality of substrates having undergone the imprint process are loaded into the overlay inspection apparatus 101 and an overlay inspection is performed therein.

Figure 2A:
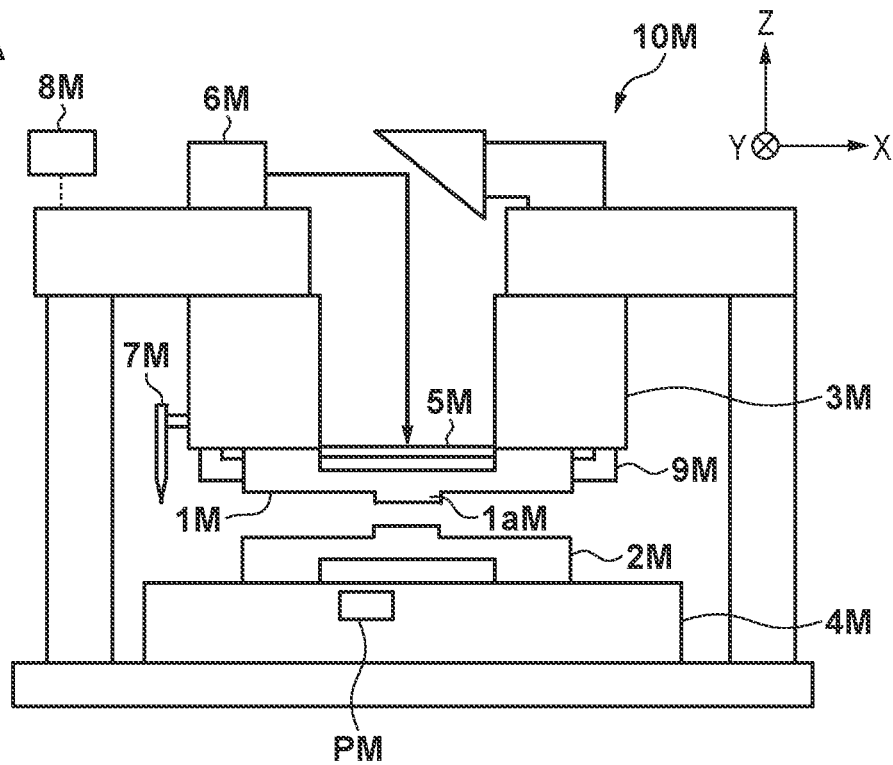
FIG. 2A is a view showing the arrangement of a mold imprint apparatus according to the embodiment.

FIG. 2A is a view schematically showing the arrangement of the mold imprint apparatus 10M. In the mold imprint apparatus 10M, a mold head 3M holds a master mold 1M and positions the master mold 1M. A stage 4M holds a replica mold 2M (blank mold) and positions the replica mold 2M. A shape correcting unit 9M (first shape correcting unit) corrects the shape of the master mold 1M so as to reduce the shape difference between a shot region of the replica mold 2M in which a pattern is to be formed and a pattern region 1aM of the master mold 1M. The mold imprint apparatus 10M can further include a curing device 6M that cures the imprint material, and a supply device 7M that supplies the imprint material onto the shot region of the replica mold 2M.

A concave portion (cavity) larger than the pattern region 1aM is formed in the surface of the master mold 1M opposite to the pattern region 1aM. The upper part of the concave portion is sealed with a flat optical element 5M, so that a closed space (first space) is formed between the master mold 1M and the flat optical element 5M. The flat optical element 5M is formed by a light transmissive member such as silica glass. The pressure in the closed space formed in this manner can be adjusted by a pressure adjustment apparatus (not shown). By increasing the pressure in the closed space to be higher than the outside, the master mold 1M can be elastically deformed such that the pattern region 1aM of the master mold 1M bends in a convex shape toward the replica mold 2M to be processed. When the master mold 1M is brought into contact with the imprint material on the replica mold 2M while the pattern region 1aM of the master mold 1M bends in a convex shape toward the replica mold 2M, the contact is started from the center of the pattern. As a result, it is possible to suppress air trapped between the imprint material and the master mold 1M, and suppress generation of pattern defects due to unfilling of the imprint material.

In this embodiment, a pressure sensor PM is provided in the stage 4M. The pressure sensor PM detects the pressure acting on the stage 4M due to contact between the master mold 1M and the imprint material on the replica mold 2M. The pressure sensor PM functions as a sensor that detects the contact state between the master mold 1M and the imprint material on the replica mold 2M by detecting the pressure acting on the stage 4M. Note that the pressure sensor PM may be provided in the mold head 3M.

A controller 8M controls the above-described respective components in the mold imprint apparatus 10M. The controller 8M can be formed from, for example, a PLD (Programmable Logic Device) such as an FPGA (Field Programmable Gate Array), an ASIC (Application Specific Integrated Circuit), a general-purpose computer installed with a program, or a combination of all or some of these components. In addition, the controller 8M is communicably connected to the management apparatus 20 and managed/controlled by the management apparatus 20. "Management/control" includes, for example, transmission/reception of sensor data, control data of the respective components, control parameters, and the like at the time of an imprint operation, and transmission of a control instruction from the management apparatus 20 to the mold imprint apparatus 10M. Each of the mold imprint apparatus 10M and the substrate imprint apparatus 10W includes a receiving unit that receives data. For example, the mold imprint apparatus 10M can receive data output from the substrate imprint apparatus 10W via the management apparatus 20. However, in the present invention, the existence of the management apparatus 20 separated from the mold imprint apparatus 10M and the substrate imprint apparatus 10W is not essential. Some or all of the functions of the management apparatus 20 may be implemented in the controller 8M or a controller 8W. Alternatively, some or all of the functions of the controller 8M or the controller 8W may be implemented in the management apparatus 20.

The master mold 1M can be made of, for example, a material such as quartz that can transmit ultraviolet light. The master mold 1M includes the pattern region 1aM on the surface facing the replica mold 2M. The pattern region 1aM includes an uneven pattern to be transferred to the imprint material supplied onto a shot region of the replica mold 2M. The replica mold 2M (blank mold) is made of, for example, a material such a quartz that can transmit ultraviolet light. The replica mold 2M can be provided with an adhesion layer, as needed, in order to improve the adhesion between the imprint material and the replica mold 2M.

The mold head 3M includes a holding mechanism for holding the master mold 1M and a driving mechanism for positioning the master mold 1M. The master mold 1M is held using, for example, vacuum suction, and driven using an actuator such as a linear motor. The mold head 3M can be configured to drive the master mold 1M in a plurality of axes (for example, three axes including the Z-, θX-, and θY-axes, or six axes including the X-, Y-, Z-, θX-, θY-, and θZ-axes). The driving mechanism of the mold head 3M can perform driving for bringing the imprint material on the replica mold 2M into contact with the pattern region 1aM of the master mold 1M. Further, the driving mechanism of the mold head 3M can perform driving for separating the cured imprint material (a pattern of the cured product) from the master mold 1M. Furthermore, the driving mechanism of the mold head 3M may substitute the pressure sensor PM by calculating the driving force from a drive command value, for example, a command current value for the actuator used for the driving, and using the calculated driving force as a pressing force.

The stage 4M includes a holding mechanism for holding the replica mold 2M and a driving mechanism for positioning the replica mold 2M. The replica mold 2M is held using, for example, vacuum suction, and driven using an actuator such as a linear motor. The stage 4M can be configured to drive the replica mold 2M in a plurality of axes (for example, three axes including the Z-, θX-, and θY-axes, or six axes including the X-, Y-, Z-, θX-, θY-, and θZ-axes).

The shape correcting unit 9M deforms the shape of the pattern region 1aM of the master mold 1M. The shape correcting unit 9M can include, for example, a plurality of actuators (for example, piezoelectric elements) each of which applies a force to the side surface of the master mold 1M. The shape correcting unit 9M may include a deformation unit that deforms a shot region of the replica mold 2M by heating the replica mold 2M.

The supply device 7M supplies (applies) the imprint material onto the replica mold 2M. The imprint material is supplied onto the replica mold 2M by discharging the imprint material from the supply device 7M while moving the replica mold 2M by the stage 4M. The curing device 6M cures the imprint material by supplying or applying energy (for example, light such as ultraviolet light) for curing the imprint material. Thus, a pattern made of a cured product of the imprint material is formed.

Figure 2B:
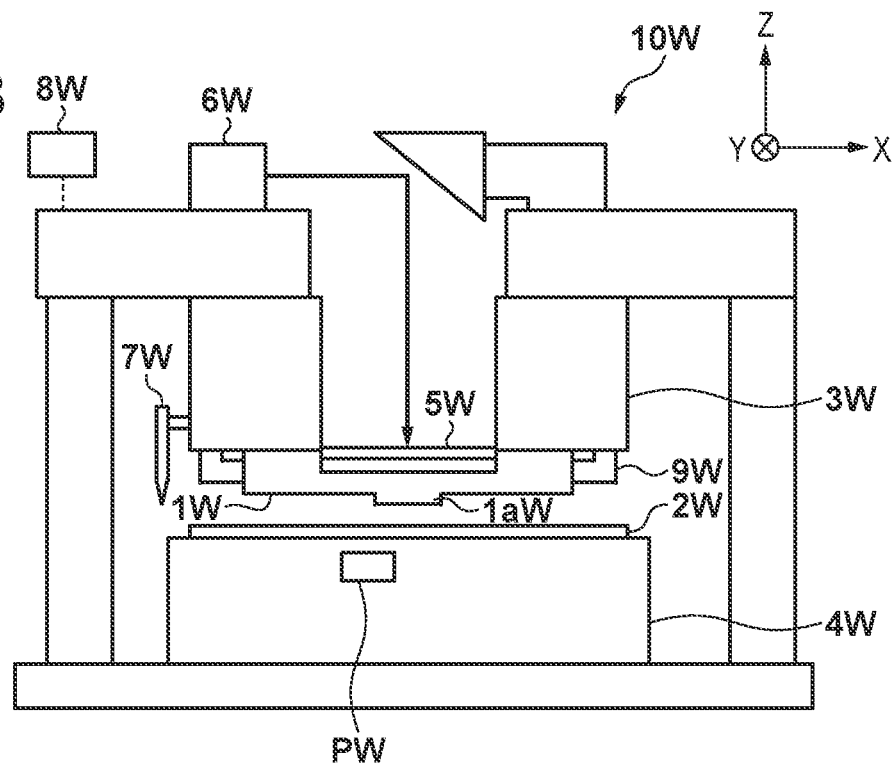
FIG. 2B is a view showing the arrangement of a substrate imprint apparatus according to the embodiment.

FIG. 2B is a view schematically showing the arrangement of the substrate imprint apparatus 10W. As can be seen from FIGS. 2A and 2B, most of the arrangement is similar in the mold imprint apparatus 10M and the substrate imprint apparatus 10W, and their components correspond as follows.

A replica mold 1W corresponds to the replica mold 2M manufactured by performing the imprint process by the mold imprint apparatus 10M. An object to be processed by the substrate imprint apparatus 10W is not the replica mold 2M but a substrate 2W. A mold head 3W that positions the replica mold 1W corresponds to the mold head 3M. A stage 4W that holds and positions the substrate 2W corresponds to the stage 4M. A curing device 6W that emits light for curing an imprint material corresponds to the curing device 6M. A supply device 7W that applies the imprint material to the substrate 2W corresponds to the supply device 7M. The controller 8W that controls the respective components of the substrate imprint apparatus 10W corresponds to the controller 8M. A shape correcting unit 9W (second shape correcting unit) that changes the shape of the replica mold 1W corresponds to the shape correcting unit 9M. A flat optical element 5W for forming a closed space (second space) on the side opposite to a pattern region 1aW of the replica mold 1W corresponds to the flat optical element 5M. A pressure sensor PW for detecting the pressure acting on the stage 4W due to contact between the replica mold 1W and the imprint material on the substrate 2W corresponds to the pressure sensor PM.

As described above, the replica mold 1W is manufactured by performing the imprint process by the mold imprint apparatus 10M. The substrate 2W is made of, for example, a material such as silicon. An object to be processed in the mold imprint apparatus 10M is the replica mold 2M, and the imprint process is performed on one region. On the other hand, in the substrate imprint apparatus 10W, an object to be processed is the substrate 2W, and the imprint process is sequentially performed on a plurality of shot regions formed on the substrate 2W. The stage 4W is configured to be able to hold the substrate 2W. For example, vacuum suction is used for holding the substrate 2W.

Next, with reference to FIG. 3A, the sequence of an imprint operation in the mold imprint apparatus 10M will be described. A control program according to this flowchart is stored in, for example, a memory in the controller 8M, and can be executed by a processor in the controller 8M.

First, in step S101, the replica mold 2M is loaded into the mold imprint apparatus 10M and held by the stage 4M. In step S102, the supply device 7M supplies an imprint material onto a shot region of the replica mold 2M. In step S103, the controller 8M drives the stage 4M such that the replica mold 2M is arranged below the master mold 1M. In step S104, the mold head 3M controls the Z-direction position of the mold head 3M (that is, the master mold 1M) such that the master mold 1M is brought into contact with the imprint material supplied onto the replica mold 2M. At this time, the contact state between the master mold 1M and the imprint material on the replica mold 2M is monitored using the detection result of the pressure sensor PM. By this contact, the imprint material is filled between the master mold 1M and the replica mold 2M. After the filling is completed, the process advances to step S105.

In step S105, the curing device 6M irradiates the imprint material with light to cure the imprint material. In step S106, the mold head 3M controls the Z-direction position so as to separate the master mold 1M from the imprint material (mold separation). After the separation is completed, the replica mold 2M is unloaded from the mold imprint apparatus 10M in step S107.

Next, with reference to FIG. 3B, the sequence of an imprint operation in the substrate imprint apparatus 10W will be described. A control program according to this flowchart is stored in, for example, a memory in the controller 8W, and can be executed by a processor in the controller 8W.

First, in step S201, the substrate 2W is loaded into the substrate imprint apparatus 10W and held by the stage 4W. In step S202, the supply device 7W supplies an imprint material onto a shot region of the substrate 2W. In step S203, the controller 8W drives the stage 4W such that the shot region of the substrate 2W is arranged below the replica mold 1W. In step S204, the mold head 3W controls the Z-direction position of the mold head 3W (that is, the replica mold 1W) such that the replica mold 1W is brought into contact with the imprint material applied on the shot region of the substrate 2W. At this time, the contact state between the replica mold 1W and the imprint material on the substrate 2W is monitored using the detection result of the pressure sensor PW. By this contact, the imprint material is filled between the replica mold 1W and the substrate 2W. After the filling is completed, the process advances to step S205.

In step S205, the curing device 6W irradiates the imprint material with light to cure the imprint material. In step S206, the mold head 3W controls the Z-direction position so as to separate the replica mold 1W from the imprint material (mold separation). After the separation is completed, the controller 8W determines in step S207 whether there is a shot region to undergo the imprint process next on the substrate 2W. If there is a shot region to undergo the imprint process next, the process returns to step S202 and the process is repeated for the next shot region. On the other hand, if it is determined in step S207 that there is no shot region to undergo the imprint process next, the process advances to step S208, and the substrate 2W is unloaded from the substrate imprint apparatus 10W.

Figure 4A:
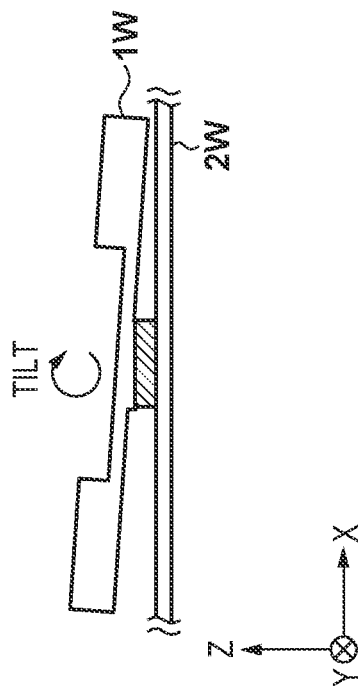
FIGS. 4A to 4D are views for explaining extrusion of an imprint material.

Next, with reference to FIGS. 4A to 4D, extrusion of the imprint material caused by the contact between the replica mold 1W and the imprint material on the substrate 2W will be described. FIG. 4A is an X-Z sectional view of the replica mold 1W, the substrate 2W, and the imprint material after the contact in step S204. The hatched portion represents the imprint material. The replica mold 1W is being pressed in the direction of the substrate 2W by the mold head 3. The pressing force at this time is indicated by arrows F. FIG. 4A shows an enlarged view of a corner portion A of the imprint material. When the replica mold 1W is pressed against the substrate 2W in the Z direction with the pressing force indicated by the arrows F, the pressure of the imprint material increases, and the imprint material expands to the surroundings (in the X-Y plane direction). This may cause the imprint material to extrude to the outside of the imprint region. The extrusion amount of the imprint material changes depending on the pressing force. In addition, the extrusion amount of the imprint material can change depending on the supply amount or supply method of the imprint material by the supply device 7W. If the imprint material is cured in step S205 with the imprint material extrusion out of the imprint region, the following problem occurs.

When subsequently performing the imprint process on the imprint regions on the substrate 2W, if the imprint process is performed on a shot region with the extruded imprint material, the replica mold 1W is placed on the extruded imprint material. Therefore, the imprint process may not be performed in a normal state. If the imprint process is not performed in a normal state, the region becomes defective and there is a risk that the yield will be reduced.

Figure 4B:
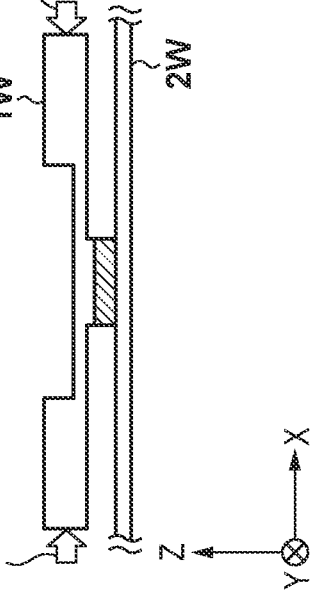
Figure 4C:
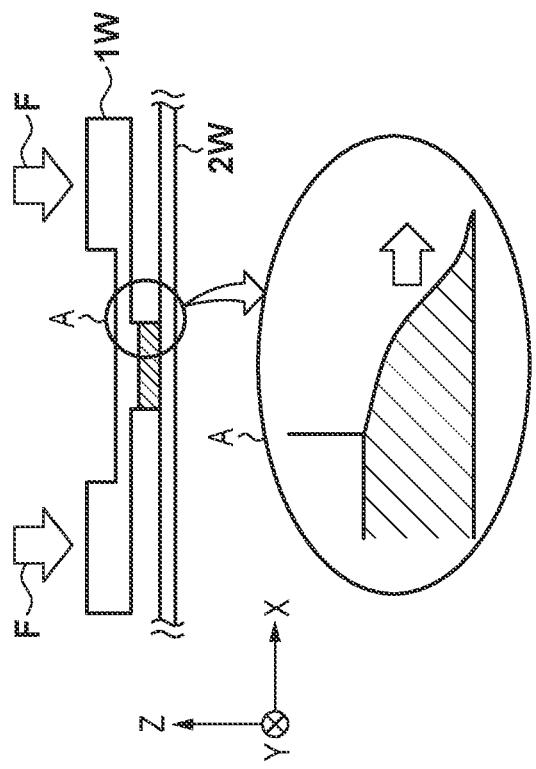
Figure 4D:
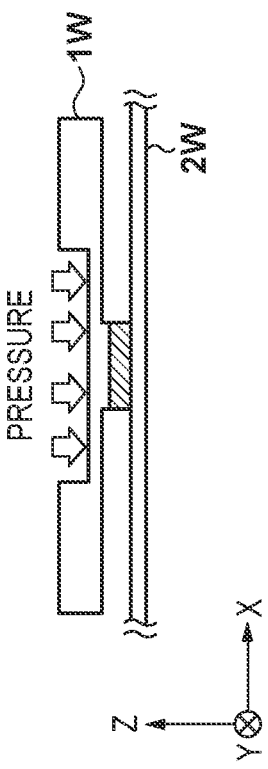

Each of FIGS. 4B to 4D shows another example in which the imprint material can extrude out due to the contact between the replica mold 1W and the imprint material on the substrate 2W. As shown in FIG. 4B, when there is an inclination (tilt) between the replica mold 1W and the substrate 2W, extrusion of the imprint material can also occur. Further, as shown in FIG. 4C, extrusion of the imprint material can occur by changing the pressure (cavity pressure) in the closed space formed on the back side of the pattern region 1aW of the replica mold 1W. Furthermore, as shown in FIG. 4D, even when a force (shape correcting force) is applied to the side surfaces of the replica mold 1W by the shape correcting unit 9W, the replica mold 1W is deformed downward and extrusion of the imprint material can occur.

The effect of changing the pressing force is not only extrusion of the imprint material. Since the replica mold 1W is elastically deformed by the pressing force, the pattern region 1aM of the replica mold is also deformed. FIG. 5A shows an example of the deformation of the pattern region 1aW of the replica mold 1W in the X-Y plane direction caused by the pressing force. The shape before the deformation is indicated by a solid line, and the shape after the deformation caused by the pressing force is indicated by a broken line. The shape of the pattern region 1aM before the deformation ideally matches the shape of the shot region. However, the corner portions of the pattern region 1aM are deformed by the pressing force. Similarly, a tilt causes elastic deformation of the replica mold 1W, so that the pattern region 1aW of the replica mold 1W is also deformed. FIG. 5B shows an example of the deformation of the pattern region 1aW of the replica mold 1W in the X-Y plane direction caused by a tilt around the Y-axis. The shape before the deformation is indicated by a solid line, and the shape after the deformation caused by the tilt is indicated by a broken line. As can be seen, large deformation occurs in the corner portions due to the tilt. By controlling each of the pressing force, the tilt, and the cavity pressure, the overlay accuracy between the mold and the substrate can be improved.

Figure 6A:
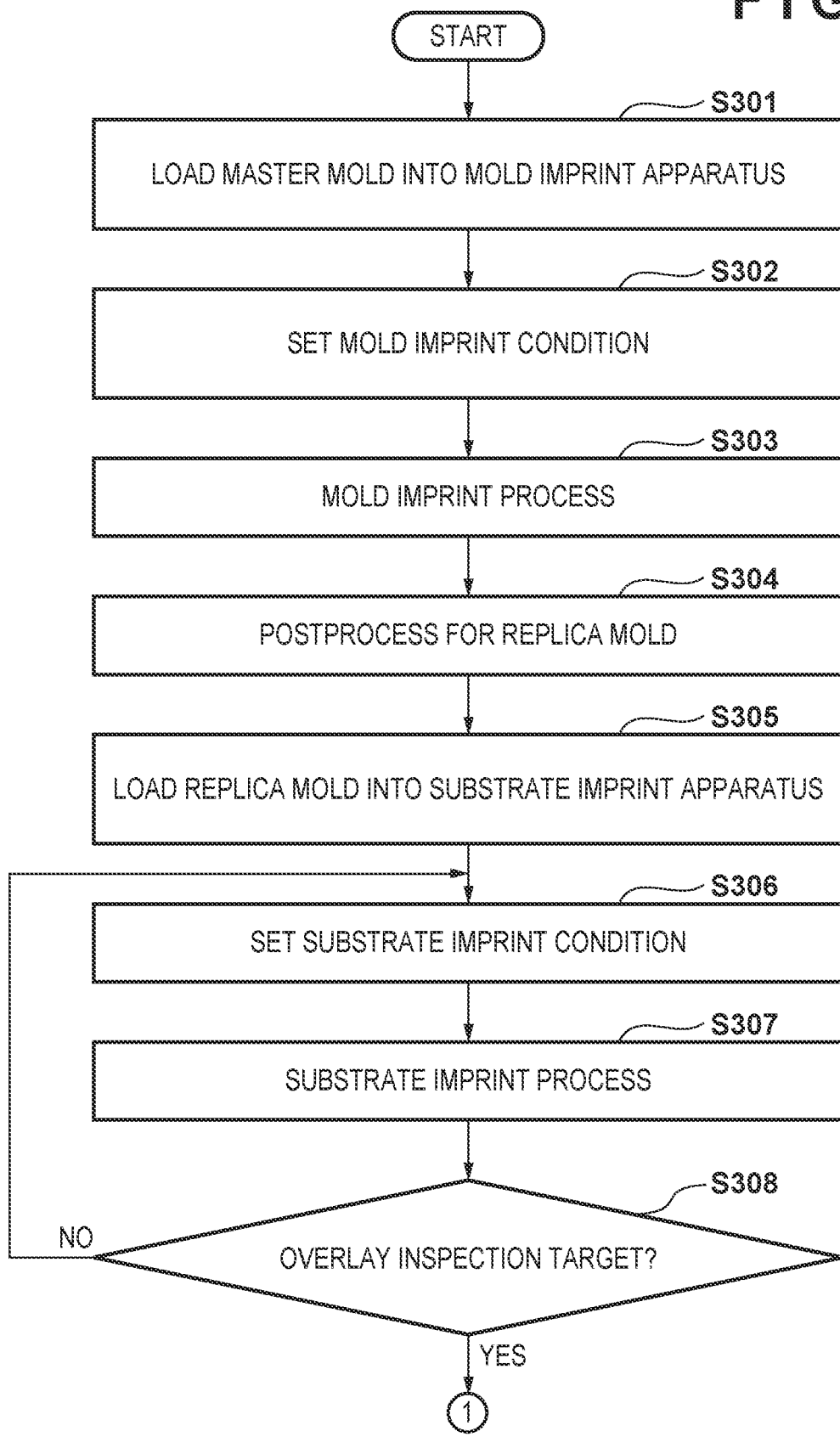
FIGS. 6A and 6B are flowcharts showing the operation of the imprint system according to the embodiment.
Figure 6B:
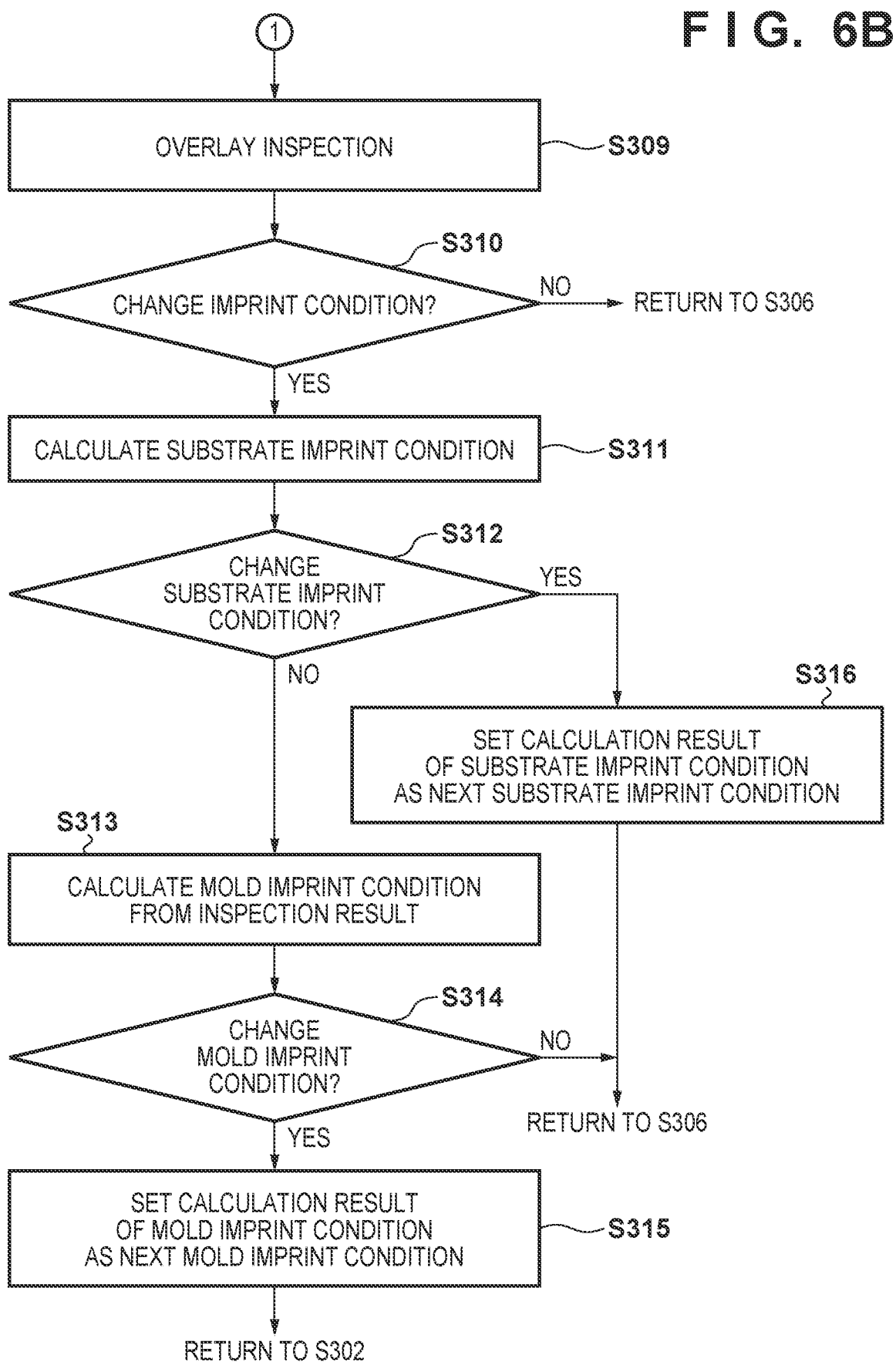

As has been described above, each of the pressing force, the inclination amount, the cavity pressure, and the shape correcting force is a parameter that influences both extrusion and overlay. However, the pressing force adjusted so as not to cause extrusion is not necessarily optimal in terms of the overlay accuracy. For example, if the pressing force is adjusted so as not to cause extrusion, the overlay accuracy can be deteriorated. In the imprint system according to this embodiment, both suppression of extrusion and the overlay accuracy are achieved. FIGS. 6A and 6B are flowcharts showing the operation of the imprint system 100 according to this embodiment. This operation is controlled by, for example, the management apparatus 20.

In step S301, the master mold 1M is loaded into the mold imprint apparatus 10M. In step S302, mold imprint conditions, which are conditions of an imprint process performed by the mold imprint apparatus 10M, are set. The mold imprint conditions can include a pressing force, an inclination amount, a cavity pressure, and a shape correcting force. The mold imprint conditions can further include a control parameter of the stage 4M, a contact time (pressing time) between the master mold 1M and the imprint material, and a light irradiation time (exposure amount) by the curing device 6M.

In step S303, the mold imprint apparatus 10M performs an imprint process (mold imprint process) as shown in FIG. 3A in accordance with the mold imprint conditions set in step S302.

In step S304, postprocessing for the replica mold is performed. The postprocessing includes etching or processing for making the replica mold 2M with a pattern formed by the mold imprint apparatus 10M ready for use as a replica mold.

In step S305, the replica mold manufactured in step S304 is loaded into the substrate imprint apparatus 10W.

In step S306, substrate imprint conditions, which are conditions of an imprint process performed by the substrate imprint apparatus 10W, are set. The substrate imprint conditions can include a pressing force, a tilt, a cavity pressure, and a shape correcting force. The substrate imprint conditions can further include a control parameter of the stage 4W, a contact time (pressing time) between the replica mold 1W and the imprint material, and a light irradiation time (exposure amount) by the curing device 6W. The details of substrate imprint condition setting processing in step S306 will be described later.

In step S307, the substrate imprint apparatus 10W performs an imprint process (substrate imprint process) as shown in FIG. 3B in accordance with the substrate imprint conditions set in step S306.

In step S308, it is determined whether the substrate processed in step S307 is an overlay inspection target. A total inspection of the substrates may be performed, or a sampling inspection may be performed. The determination executed in step S308 is for a sampling inspection. If the substrate processed in step S307 is not an overlay inspection target, the process returns to step S306, and the process of the next substrate is performed. If the substrate processed in step S307 is an overlay inspection target, the process advances to step S309. In step S309, the substrate 2W is conveyed to the overlay inspection apparatus 101, and an overlay inspection is performed on the substrate 2W. With the overlay inspection, the overlay state between the pattern formed on the shot region and the shot region is obtained. Any overlay inspection method can be used. For example, a method in which marks for an overlay inspection are captured by a camera and image processing is performed to calculate the overlay accuracy can be used.

In step S310, it is determined, for example, based on the degree of achievement of the overlay accuracy obtained in step S309 with respect to a target value, whether it is required to change the mold imprint condition or the substrate imprint condition. If the degree of achievement of the overlay accuracy with respect to the target value is sufficient, it is not required to change the imprint conditions. In that case, the process returns to step S306, and the process is repeated for the next substrate. On the other hand, if the degree of achievement of the overlay accuracy with respect to the target value is insufficient, the process advances to step S311.

In step S311, a calculation for optimizing the substrate imprint condition is executed based on the overlay inspection result in step S309. The purpose of the optimization is to determine the parameter such that the overlay state obtained in step S309 falls within an allowable range (for example, so as to minimize the inspection result). The parameter can include at least one of the pressing force, the tilt, the cavity pressure, and the shape correcting force. The parameter can further include the control parameter of the stage 4W and the control command value of the shape correcting unit 9W. Note that as described above, each of the parameters of the pressing force, the tilt, the cavity pressure, the shape correcting force is a parameter that influences extrusion. Therefore, in step S311, a constraint condition is given to each of the pressing force, the tilt, the cavity pressure, and the shape correcting force so as not to influence extrusion, or these parameters are excluded from the optimization. A specific optimization calculation method may follow the method described in Japanese Patent Laid-Open No. 2013-055327. In this manner, the substrate imprint condition is set such that the overlay state falls within the allowable range under the constraint condition regarding extrusion.

For example, the controller can hold, as data, the influence of each parameter with respect to the overlay accuracy as shown in FIGS. 5A and 5B, and calculate the substrate imprint condition by fitting the data with the overlay inspection result.

Next, in step S312, based on the calculation result in step S311, it is determined whether to change the substrate imprint condition. For example, an estimated value of the overlay accuracy is calculated from the calculation result in step S311, and the determination is executed by comparing the estimated value and a target value. If the estimated value is sufficiently close to the target value, it is not required to change the substrate imprint condition, and the process advances to step S313. If the estimated value is not sufficiently close to the target value, it is determined to change the substrate imprint condition, and the process advances to step S316.

In step S313, a calculation for optimizing the mold imprint condition is executed based on the overlay inspection result in step S309. The purpose of the optimization is to determine the parameter such that the overlay state obtained by the overlay inspection in step S309 falls within the allowable range (for example, so as to minimize the overlay inspection result) without any extrusion constraint condition. The parameter can include the pressing force, the tilt, the cavity pressure, and the shape correcting force. The parameter can further include the control parameter of the stage 4M and the control command value of the shape correcting unit 9M. In the mold imprint apparatus 10M, extrusion does not cause a problem. Therefore, a constraint condition on each of the pressing force, the tilt, the cavity pressure, and the shape correcting force can be set in a broader range than the constraint condition in step S311. Under such a condition, the optimization calculation can be executed in a manner similar to that in step S311.

Next, in step S314, it is determined whether to change the mold imprint condition based on the calculation result in step S313. If an improvement in overlay accuracy cannot be expected even if the mold imprint conditions are changed, the process returns to step S306 and the process is repeated for the next substrate. On the other hand, if it is determined to change the mold imprint condition, the process advances to step S315.

In step S315, the calculation result of the mold imprint condition in step S313 is set as the next mold imprint condition, and then the process returns to step S302. In step S316, the calculation result of the substrate imprint condition in step S311 is set as the next substrate imprint condition, and the process returns to step S306.

The effect of the above-described operation of the imprint system 100 will be described. In step S311, the condition (substrate imprint condition) of the imprint process in the substrate imprint apparatus 10W is corrected based on the overlay inspection result (step S309). However, simply correcting the substrate imprint condition cannot sufficiently optimize the parameter such as the pressing force, the tilt, the cavity pressure, or the shape correcting force in terms of overlay accuracy due to the constraint for suppressing extrusion. Therefore, in step S313, the condition (mold imprint condition) of the imprint process in the mold imprint apparatus 10M is corrected based on the overlay inspection result (step S309) of the substrate 2W processed by the substrate imprint apparatus 10W. Here, as compared with the calculation in S311, the constraint on each of the pressing force, the tilt, the cavity pressure, and the shape correcting force is relaxed, which is advantageous in optimization calculation. Thus, the replica mold 1W is manufactured into a shape that improves the overlay accuracy of the substrate 2W which undergoes the imprint process in the substrate imprint apparatus 10W. Therefore, an improvement in overlay accuracy can be expected.

Deformation caused by the pressing force, the tilt, or the like is typical in the corner portions as shown in FIGS. 5A and 5B. This is not deformation such as, for example, a shift, a rotation, or a magnification that can be expressed by a simple mathematical expression, so that it is difficult to correct such a shape by the shape correcting unit 9W. Accordingly, deformation caused by the pressing force or the tilt can be corrected by, for example, optimizing the pressing force or the tilt. In this embodiment, deformation generated in the substrate imprint apparatus 10W caused by the pressing force, the tilt, or the cavity pressure of the substrate imprint apparatus 10W can be corrected by changing the pressing force, the tilt, or the cavity pressure of the mold imprint apparatus 10M. Therefore, it is possible to accurately correct the deformation caused by the pressing force or the tilt without any constraint for suppressing extrusion.

FIG. 7 is a flowchart showing an example of mold imprint condition calculation processing in step S313 in this embodiment.

In step S401, the result of the overlay inspection executed in step S309 is acquired. In step S402, the type of the master mold 1M is acquired. In step S403, based on the type of the master mold 1M acquired in step S402, correction data for the pressing force and the tilt is acquired or calculated. Thereafter, in step S404, a calculation for optimizing the mold imprint condition is executed using the correction data acquired in step S403. The optimization calculation can be executed in a manner similar to that in step S311.

Figure 8A:
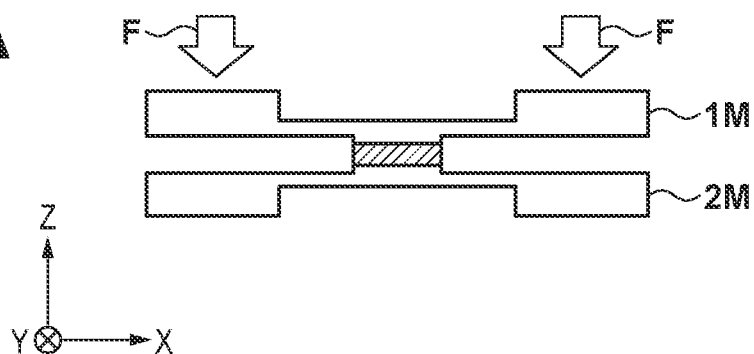
FIGS. 8A and 8B are views showing examples of a plurality of types of master molds.
Figure 8B:
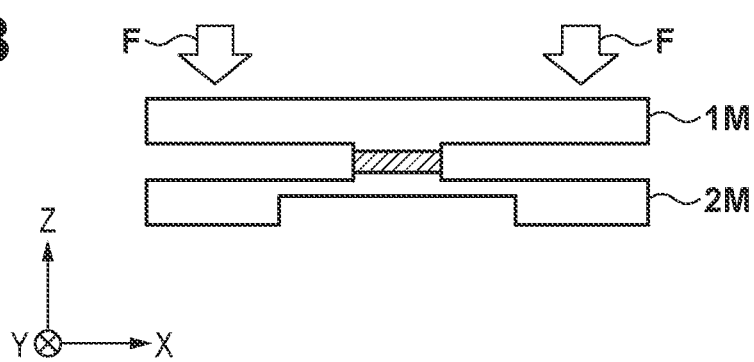

The type of the master mold 1M acquired in step S402 will be described. Each of FIGS. 8A and 8B shows a state in which the master mold 1M and the imprint material on the replica mold 2M are in contact with each other (step S104). The master mold 1M in FIG. 8A is provided with a concave portion (cavity) on the surface opposite to the surface which contacts the imprint material. The master mold 1M in FIG. 8A is typically a replica mold, and FIG. 8A assumes a situation in which another replica mold is manufactured from the replica mold. On the other hand, the master mold 1M in FIG. 8B is flat without such a concave portion. That is, the master mold 1M in FIG. 8B is typically an original master mold, and FIG. 8B assumes a situation in which a replica mold is manufactured from the original master mold.

When the pressing force F is applied to the master mold 1M with the concave portion as shown in FIG. 8A, the master mold 1M is greatly elastically deformed as compared with the master mold without the concave portion as shown in FIG. 8B. Therefore, the magnitude of deformation in the X-Y plane direction caused by the pressing force as described with reference to FIG. 5A differs between the master mold 1M with the concave portion and the master mold 1M without the concave portion.

The management apparatus 20 serving as a controller holds, in advance, data representing the relationship between the mold imprint condition and the overlay state, so that can correct the mold imprint condition based on the data. For example, in step S402, the management apparatus 20 acquires mold type information including information regarding the dimensions and shape of the master mold 1M. For example, table data showing the relationship between the pressing force and the deformation for each mold type is acquired in advance by an experiment or simulation, and the management apparatus 20 holds the table data. In step S403, the management apparatus 20 refers to the table data, extracts data representing the relationship between the pressing force and the deformation corresponding to the mold type information acquired in step S402, and obtains correction data based on the extracted data.

The deformation caused by the pressing force has been described above, but the similar description can be applied to deformation caused by the tilt, the cavity pressure, or the shape correcting force. According to the embodiment described above, the imprint system 100 acquires information regarding the type of the master mold 1M, and based on the information, a calculation for optimizing the mold imprint condition is executed. This makes it possible to correct the imprint conditions with higher accuracy and improve the overlay accuracy.

Figure 9:
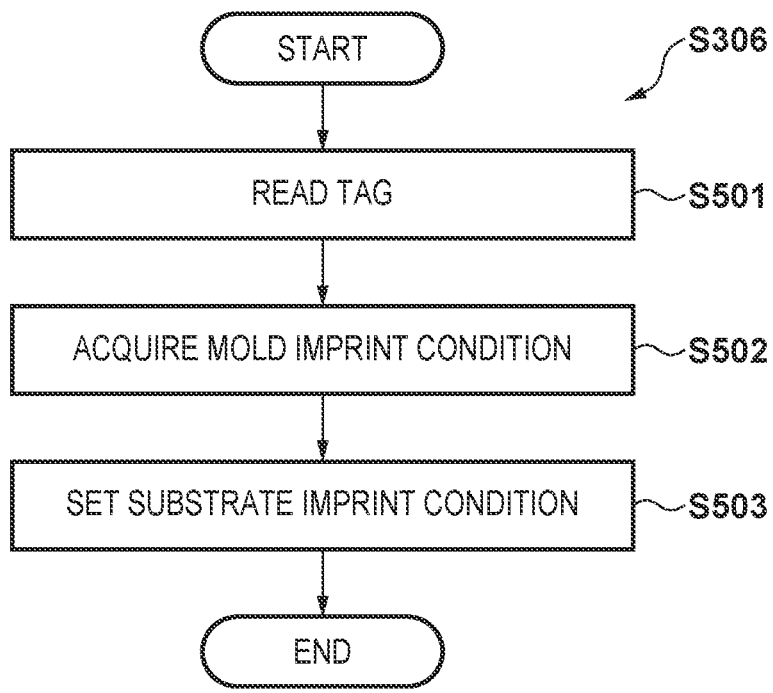
FIG. 9 is a flowchart showing an example of substrate imprint condition setting processing according to the embodiment.

Next, the details of substrate imprint condition setting processing in step S306 will be described with reference to FIG. 9. In the imprint system 100 according to this embodiment, the mold imprint condition may be changed when the replica mold 1W is manufactured by the mold imprint apparatus 10M. Therefore, the management apparatus 20 manages the mold imprint conditions applied to each of the used replica molds. Then, when the replica mold 1W is loaded into the substrate imprint apparatus 10W, the substrate imprint apparatus 10W sets the substrate imprint conditions reflecting the mold imprint conditions corresponding to the replica mold 1W.

In step S501, for example, the substrate imprint apparatus 10W reads the tag of the loaded replica mold 1W, and acquires information on the replica mold 1W. Then, in step S502, the substrate imprint apparatus 10W acquires, based on the information acquired in step S501, the mold imprint conditions used when the loaded replica mold 1W has undergone the imprint process in the mold imprint apparatus 10M. In step S503, the substrate imprint apparatus 10W sets substrate imprint conditions based on the information acquired in step S502. More specifically, based on the information of the pressing force, the tilt, the cavity pressure, and the shape correcting force among the mold imprint conditions acquired in step S502, the substrate imprint apparatus 10W estimates the deformation amount of the pattern region 1aW of the loaded replica mold 1W. Then, the substrate imprint apparatus 10W sets the substrate imprint conditions so as to correct the estimated deformation amount.

<Embodiment of Article Manufacturing Method>

A pattern of a cured material formed by using an imprint apparatus is used permanently for at least some of various articles, or is used temporarily when manufacturing various articles. The articles include an electric circuit element, an optical element, a MEMS, a recording element, a sensor, and a mold. Examples of the electric circuit element are a volatile or nonvolatile semiconductor memory such as a DRAM, an SRAM, a flash memory, or an MRAM and a semiconductor element such as an LSI, a CCD, an image sensor, or an FPGA. An example of the mold is an imprinting mold.

The pattern of a cured material is used unchanged as a constituent member for at least some of the foregoing articles, or is temporarily used as a resist mask. The resist mask is removed after etching, ion implantation, or the like is performed in a substrate processing step.

Next, the article manufacturing method will be described. In step SA of FIG. 10, a substrate 1z which is a silicon substrate or the like on whose surface a processing target material 2z such as an insulator is formed is prepared, and next, an imprint material 3z is applied to the surface of the processing target material 2z by an ink-jet method. A state in which the imprint material 3z in the form of a plurality of droplets is applied onto the substrate is shown here.

Figure 10:
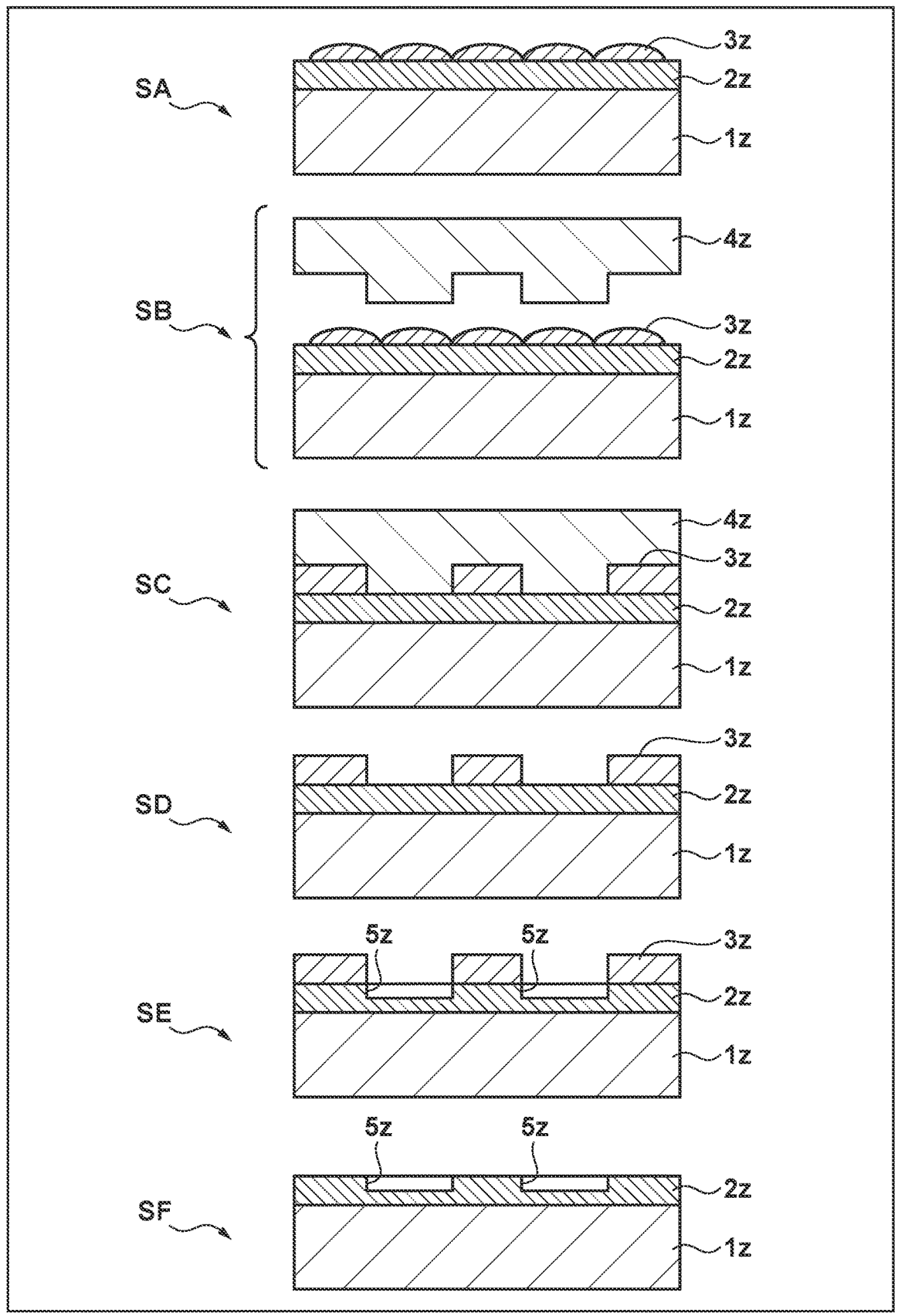
FIG. 10 is a view for explaining an article manufacturing method according to the embodiment.

As shown in step SB of FIG. 10, a side of an imprinting mold 4z on which its three-dimensional pattern is formed faces the imprint material 3z on the substrate. In step SC of FIG. 10, the substrate 1z to which the imprint material 3z has been applied and the mold 4z are brought into contact, and pressure is applied. Gaps between the mold 4z and the processing target material 2z is filled with the imprint material 3z. When the imprint material 3z is irradiated with light as curing energy through the mold 4z in this state, the imprint material 3z is cured.

In step SD of FIG. 10, when the mold 4z and the substrate 1z are separated after the imprint material 3z is cured, a pattern of the cured material of the imprint material 3z is formed on the substrate 1z. The pattern of this cured product has a shape such that the concave portion of the mold corresponds to the convex portion of the cured product, and the convex portion of the mold corresponds to the concave portion of the cured product; that is, the three-dimensional pattern of the mold 4z is transferred to the imprint material 3z.

In step SE of FIG. 10, when the pattern of the cured material is etched as an etching resistant mask, portions out of the surface of the processing target material 2z where the cured material is not present or thinly remains are removed, and grooves 5z are achieved. In step SF of FIG. 10, when the pattern of the cured material is removed, it is possible to achieve an article in which the grooves 5z are formed on the surface of the processing target material 2z. The pattern of the cured product is removed here; however, the pattern of the cured product may be used as, for example, an interlayer dielectric film included in the semiconductor element or the like, that is, the constituent member of the article without removing it after processing.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-043043, filed Mar. 8, 2019, which is hereby incorporated by reference herein in its entirety.

What is claimed is:

1. An imprint system comprising:
a replica mold manufacturing apparatus configured to manufacture a replica mold which is a replica of a master mold by performing a first imprint process of bringing the master mold into contact with an imprint material on a blank mold to form a pattern of the imprint material wherein the replica mold manufacturing apparatus is configured to manufacture the replica mold by performing the first imprint process once on a surface of the blank mold;

an imprint apparatus configured to perform a second imprint process of bringing the replica mold manufactured by the replica mold manufacturing apparatus into contact with an imprint material on a shot region of a substrate to form a pattern of the imprint material, wherein a plurality of shot regions are provided on the substrate and the imprint apparatus is configured to perform the second imprint process on each of the plurality of shot regions on the substrate; and a controller, including a memory and a processor, configured to set a first imprint condition that is an imprint condition of the first imprint process to be used in the replica mold manufacturing apparatus and a second imprint condition that is an imprint condition of the second imprint process to be used in the imprint apparatus, wherein the controller is configured to:

form the pattern on the shot region by performing the second imprint process using the second imprint condition set such that an extrusion of the imprint material does not occur from the shot region and an overlay state falls within an allowable range, with the imprint apparatus using the replica mold manufactured by performing the first imprint process with the replica mold manufacturing apparatus, obtain the overlay state between the shot region and the pattern formed on the shot region by performing the second imprint process using the second imprint condition, and correct the first imprint condition of the replica mold manufacturing apparatus, to be used in a manufacture of a next replica mold so that the next replica mold is manufactured in which a difference between a value obtained from the obtained overlay state and a target value of the overlay is reflected and the overlay state falls within an allowable range.

2. The system according to claim 1, wherein the first imprint condition includes a pressing force of the master mold with respect to the imprint material on the blank mold upon bringing the master mold into contact with the imprint material on the blank mold, and the second imprint condition includes a pressing force of the replica mold with respect to the imprint material on the substrate upon bringing the replica mold into contact with the imprint material on the substrate.

3. The system according to claim 1, wherein the first imprint condition includes an inclination amount between the master mold and the blank mold, and the second imprint condition includes an inclination amount between the replica mold and the substrate.

4. The system according to claim 1, wherein the master mold is configured to deform into a convex shape toward the blank mold by a pressure applied to a first space which is a space on a side of the master mold opposite to a pattern region thereof, the replica mold is configured to deform into a convex shape toward the substrate by a pressure applied to a second space which is a space on a side of the replica mold opposite to a pattern region thereof, the first imprint condition includes the pressure applied to the first space, and the second imprint condition includes the pressure applied to the second space.

5. The system according to claim 1, wherein the replica mold manufacturing apparatus comprises a first shape correcting unit configured to correct a shape of the master mold by applying a force to a side surface of the master mold, the imprint apparatus comprises a second shape correcting unit configured to correct a shape of the replica mold by applying a force to a side surface of the replica mold, the first imprint condition includes the force applied to the side surface of the master mold by the first shape correcting unit, and the second imprint condition includes the force applied to the side surface of the replica mold by the second shape correcting unit.

6. The system according to claim 1, wherein the controller holds, in advance, data representing a relationship between the first imprint condition and the overlay state, and corrects the first imprint condition based on the data.

7. The system according to claim 6, wherein the data includes data representing the relationship for each type of the master mold, and the controller acquires information on the type of the master mold, and corrects the first imprint condition in accordance with an imprint condition corresponding to the type acquired from the data.

8. A replica mold manufacturing apparatus that manufactures a replica mold which is a replica of a master mold by performing a first imprint process of bringing the master mold into contact with an imprint material on a blank mold to form a pattern of the imprint material, wherein the replica mold manufacturing apparatus is configured to manufacture the replica mold by performing the first imprint process once on a surface of the blank mold, the apparatus comprising:

a receiving unit configured to receive information output from an imprint apparatus that performs a second imprint process of forming a pattern of an imprint material on a shot region of a substrate using the replica mold manufactured by the replica mold manufacturing apparatus, wherein a plurality of shot regions are provided on the substrate and the imprint apparatus is configured to perform the second imprint process on each of the plurality of shot regions on the substrate; and a controller, including a memory and a processor, configured to set a first imprint condition of the first imprint process to be used in the replica mold manufacturing apparatus based on the information received by the receiving unit, wherein the information includes information of the pattern formed on the shot region by performing the second imprint process using a second imprint condition set such that an extrusion of the imprint material does not occur from the shot region and an overlay state falls within an allowable range with the imprint apparatus using the replica mold manufactured by performing the first imprint process with the replica mold manufacturing apparatus, the controller obtains the overlay state between the shot region and the pattern formed on the shot region by performing the second imprint process using the second imprint condition, and the controller corrects the first imprint condition of the replica mold manufacturing apparatus, to be used in a manufacture of a next replica mold, so that the next replica mold is manufactured in which a difference between a value obtained from the obtained overlay state and a target value of the overlay is reflected and the overlay state falls within an allowable range.

9. An article manufacturing method comprising:
forming the pattern on the substrate using the imprint system defined in claim 1, and
processing the substrate with the pattern formed thereon in the forming,
wherein an article is manufactured from the substrate having undergone the processing.

* * * * *